United States Patent [19]

Heinonen et al.

[11] 4,042,289

[45] Aug. 16, 1977

[54] PLUG CONTACT DEVICE INTENDED FOR MOUNTING ON CIRCUIT CARDS

[75] Inventors: Stig Teodor Heinonen, Järfälla; Gustav Gunnar Johansson, Huddinge, both of Sweden

[73] Assignee: Telefonaktiebolaget L M Ericsson, Stockholm, Sweden

[21] Appl. No.: 672,448

[22] Filed: Mar. 31, 1976

[30] Foreign Application Priority Data

Apr. 25, 1975 Sweden ................................ 7504816

[51] Int. Cl.$^2$ ................................................ H05K 1/10

[52] U.S. Cl. .......................... 339/17 LC; 339/176 M; 339/217 R

[58] Field of Search ...... 339/17 LC, 176 M, 176 MF, 339/176 MP, 217 R

[56] References Cited

U.S. PATENT DOCUMENTS

| | | | |
|---|---|---|---|
| 3,087,137 | 4/1963 | Linn | 339/217 R |
| 3,757,277 | 9/1973 | Yamanove | 339/176 M |

FOREIGN PATENT DOCUMENTS

| | | | |
|---|---|---|---|
| 2,333,273 | 1/1974 | Germany | 339/176 MP |

*Primary Examiner*—Roy Lake
*Assistant Examiner*—Mark S. Bicks
*Attorney, Agent, or Firm*—Hane, Sullivan & Spiecens

[57] ABSTRACT

In a plug contact to be mounted on a printed circuit board, separate flat contact springs are mounted in a plurality of parallel grooves on an insulating body. To hold the contact springs each groove is provided with projections and the contact spring is provided with mating notches. At the bottom of the front end of the projections there is a slot to receive the contact spring while a shoulder is arranged at the back end of the projections. When mounting, the contact spring is guided by the notches and projections and is pushed backwards in the groove until the forward edge of the notch is locked in the slit and the backward edge snaps over the shoulder.

6 Claims, 2 Drawing Figures

PLUG CONTACT DEVICE INTENDED FOR MOUNTING ON CIRCUIT CARDS

Figure 1:
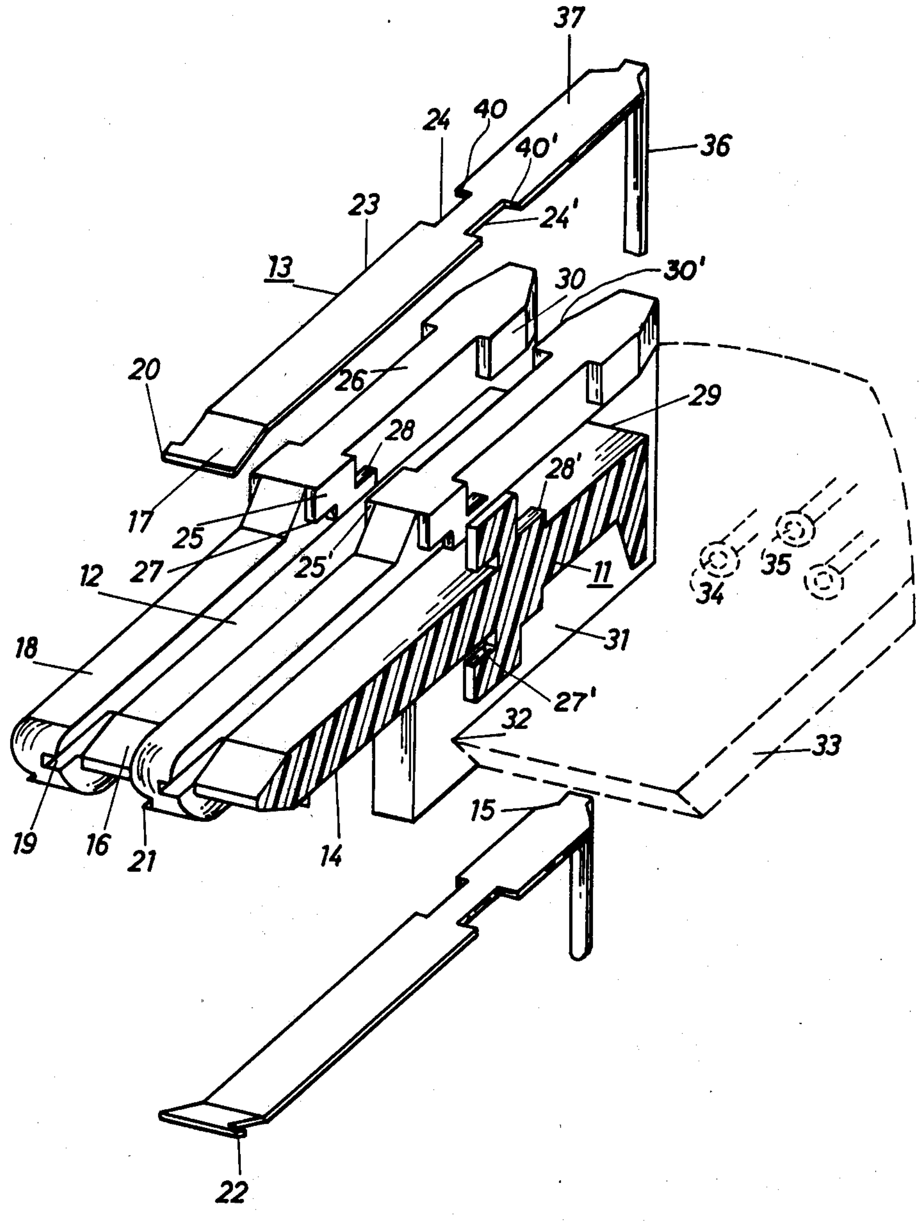

The present invention relates to a plug contact device intended for mounting on circuit boards and having a number of contact surfaces which are adjacent to each other. The plug contact device is intended to cooperate with a mating socket contact device.

In order to achieve connection between a circuit board and external circuits it is common practice to let the conducting foil on the circuit board form a number of contact fingers at one or more edges of the circuit board. These contact fingers are arranged to engage contact springs in a socket device in which is inserted the circuit board edge provided with contact fingers. In order to improve the contact, the contact fingers are usually plated with a non-corroding metal having good conductivity, generally gold.

The number of rejects after this surface treatment have proved to be relatively large. When even only one contact finger does not meet quality control criteria the whole circuit board is discarded. Especially in the cases where the surface of the circuit board is large the rejection cost will be considerable. The contact fingers consisting of a thin foil are further easily damaged when the circuit board is inserted into and is drawn out of the socket contact device. A circuit board damaged in this way generally has to be exchanged. Also in this case the cost will be very large especially for boards with many components.

In order to avoid these disadvantages there have become available circuit boards with a loose contact device, for example a plug device. With such loose contact devices one does not need the complicated and expensive surface treatment of the contact fingers and it is also possible to change the contact device itself in case of damage without discarding the whole circuit board. Contact devices of this kind are known for example by the published Swedish patent application No. 7403043-8 or the published German patent application No. 23 33 273. These plug contact devices consist in principle of a body of insulating material provided with a large number of contact springs arranged adjacent to each other and which have a front part intended to be inserted into a mating socket device and a back part intended to be connected to the printed pattern on the circuit board.

The device shown in the published Swedish patent application has two considerable disadvantages. First the contact springs are mounted by inserting them in a narrow opening in a block of insulating material. This makes the mounting operation laborious and furthermore the contact springs must be bent after they have been brought in place, causing an additional working operation. Secondly the contact spring is locked against extraction by means of a narrow tongue cut out from the contact spring which is pressed into a hole in the insulation block. This tongue is easily deformed by the stresses caused by friction when the plug device is extracted. In the worst case the hook-shaped part in the nose part of the plug device may jump out of its groove in the block causing the contact spring to lift from its groove so that it will be deformed when the next inserting occurs.

The published German patent application shows a similar contact device having an embodiment which enables the contact spring to be mounted by putting it in a guiding groove. By a minor displacement of the contact spring they are fastened partly by guide wings which are inserted in grooves in the insulating body of the plug device and partly by a cut out and bent tongue on the contact spring which snaps into a recess arranged on the bottom of the control groove. Also this contact spring has the disadvantage that the tongue does not give a reliable locking of the contact springs against the forces which appear when extracting the plug device. Furthermore, the guide wings occupy a certain extra space which encroaches on the insulation spacing to adjacent contact devices. As the front edge of the contact spring is not fixed but lies loosely in its groove there is, moreover, the risk for the contact spring to rebound and to catch in the socket device when being inserted. Such immediately destroys the contact springs.

The above mentioned drawbacks can be avoided with a contact plug device according to the invention the characteristics of which appear from the appended claims.

Figure 2:
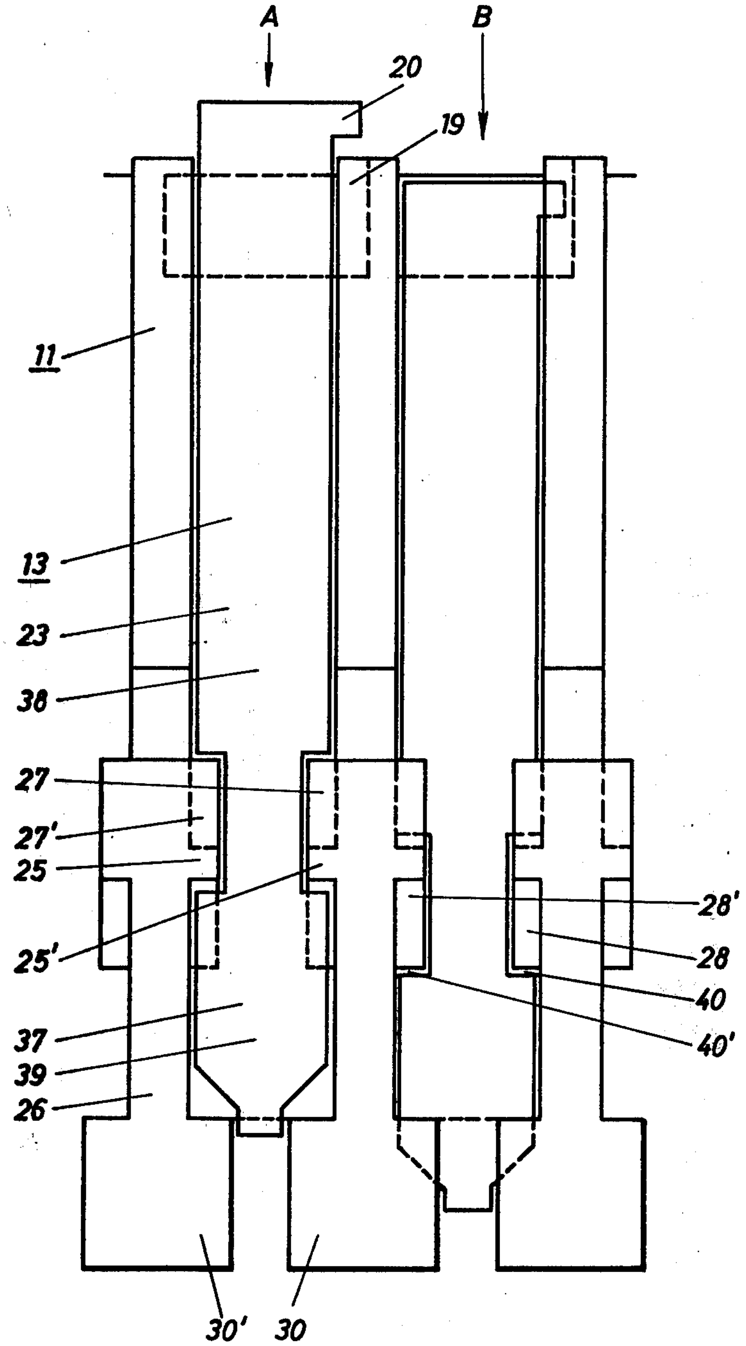

The invention will be described in connection with the accompanying drawings where: FIG. 1 shows a perspective drawing of a part of a contact plug device;

and FIG. 2 shows the insertion of a contact spring in the insulation body of the contact device.

FIG. 1 shows a small part of a strip shaped body 11 of an insulating material intended to contain two adjacent contact springs. The insulation body 11 is on the one side provided with a number of grooves 12 intended to contain contact springs 13. The other side of the insulation body 11 is provided with corresponding grooves 14 in which similar contact springs 15 are applied. It is, however, possible to have contact springs only on the one side. In the following only the details are described which lie on the upper side of the insulation body 11 but it is understood that the under side is identical the upper side unless otherwise specifically indicated especially.

At the edge of the insulation body 11 which is intended to be inserted in the corresponding socket device the front end of the groove 12 has a bevel 16 in order to facilitate the insertion. The contact spring 13 is provided with a part bent 17 in the corresponding manner. The ridges 18 remaining between the grooves 12 are protrude beyond the bevelled part 16. In the front edge of each ridge there is a slit 19 which is adapted to receive a tip 20 on the contact spring 13. On the underside of the insulation body grooves 21 for the tongue 22 are arranged in the corresponding manner. Because the slits for the lower and the upper contact springs are placed on different sides of the groove it is possible to maintain sufficient insulation spacing.

Behind the part 23 serving as contact surface on the contact spring 13 there are opposite rectangular notches 24, 24'. These notches correspond to projections 25, 25' which protrude over the groove 12 from the elevated part 26 on the ridge 18. The bottom part of each projection 25, 25' is provided with a slot. For example, slot 27 is in projection 25 and slot 27' in projection 25'; the height of the groove 25 is somewhat larger than the thickness of the contact spring 13. Behind the projection 25, 25' and joined to it there is a lock shoulder 28, 28', the height of which above the bottom of the groove is of the same size as the thickness of the contact spring 13.

The insulator body 11 has the back edge of the groove 12 at 29 and the distance between the back edge of the lock shoulders 28, 28' and the edge 29 corresponds to the rear portion 37 of the contact spring 13. The elevated part continues, however, beyond the edge 29 and is there provided with a further pair of projections 30, 30' which do not reach the plane of the groove 12. On the underside of the insulation body 11 there is no projections corresponding to 30, 30'. Instead, the elevated part of the ridge is shaped as a supporting member 31, in the grooves 32 of which the circuit board 33 bears on which the plug device is mounted. The circuit board 33 is shown with dotted lines in order to indicate that it is mounted only after the contact springs 13, 15 have been brought in place. The circuit board 33 is provided in known manner with a conducting pattern which terminates with contact islands provided with holes, for example 34, 35, in which the parts 36 shaped as contact pins on contact springs 13, 15 are inserted and are fastened by soldering. The plug device is fastened further to the circuit board by fixing the insulating body with rivets or screws (not shown).

The contact springs are mounted very simply and quickly. Suitably all the contact springs are mounted at the same time. The individual contact springs are stamped out in one strip but being still joined together suitably at the tips 20 and at the end of the contact pins 36. The connection between the individual contact springs are cut when all the contact springs have been laid down in the grooves 12 in the position which is shown in the groove A in FIG. 2. A certain pressure is applied on contact springs 13 suitably at the points 38 and 39. The contact springs are pushed backwards in the groove 12 so that the tips 20 run into the slits 19, the edges of the part 23 of the contact springs goes into the grooves 27, 27' and the back edge of the part 37 of the contact spring is pushed under the projections 30, 30'.

At the position showed in B, the backedges 40, 40' of the notches 24, 24' snap over the back of the shoulders 28, 28' and the position of the contact spring is thus fixed. The achieved locking is much more reliable than the one which is obtained in the known constructions having an unfolded tip because the edge 40, 40' is more rigid and is not so easily deformed. The safe locking insures that there is no risk for the tip 20 to jump out of its slit 19 and cause deformation of the contact spring.

The lower contact spring is mounted in the corresponding manner except for the fact that there are no shoulders which lock the back of the part 37. Then the contact device is ready to be mounted on the circuit board.

We claim:

1. A plug contact device comprising: a body of insulating material, said body being provided with a plurality of elongated parallel grooves and ridges between the grooves, a pair of projections transversely extending from said ridges and straddling and protruding into each groove at an intermediate point along the groove, said projections having a given length along the axial direction of the groove, and a given thickness in the transverse direction, the edge at one end of each projection being provided with a slot extending along the projection in the axial direction of the groove and from the base of the groove a given height upward from said base, the edge at the other end of each projection having a lock shoulder extending from said ridges and protruding into each groove for a distance substantially equal to said given thickness, the distance along the axial direction of the groove from the base of the slot to the end of the lock shoulder being substantially equal to said given length; and a plurality of contact springs of conductive material each of said contact springs being positioned in one of said parallel grooves, each of said contact springs having a thickness less than the height of the slot in said projection, each of said contact springs being provided with a pair of axially extending notches for mating engagement by said projections, the depth of said notches being substantially equal to the thickness of the projections and the length of said notches being substantially equal to said given length along the axial direction of the grooves, whereby said contact springs are lockingly held against axial movement by one edge of the contact spring at a notch resting against the base of the slot in a projection and an opposite edge of the contact spring at the same notch abutting the locking shoulder of the same projection.

2. The device of claim 1 wherein: one end of each groove is provided with a bevel and the wall of the ridge adjacent the bevel being provided with a slit; and each contact spring has a bent portion resting against the associated bevel and a laterally extending tip resting in the slit.

3. The device of claim 2 further comprising a pair of other projections at the other end of each groove, said other projections overhanging the groove so that a portion of the associated contact spring is under said other projections.

4. The device of claim 3 wherein the end of each contact spring at said other end of each groove is provided with a transversely extending contact pin portion for connection to the circuits of a circuit board.

5. The device of claim 1 wherein said grooves are on two opposite sides of said body.

6. The device of claim 1 wherein some of said ridges provide engaging means for a circuit board.

* * * * *